United States Patent
Yamaguchi et al.

(10) Patent No.: US 7,320,932 B2
(45) Date of Patent: Jan. 22, 2008

(54) SEMICONDUCTOR DEVICE AND MANUFACTURING METHOD THEREOF

(75) Inventors: Shinji Yamaguchi, Tenri (JP); Takuro Asazu, Nara (JP); Atsushi Ono, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 120 days.

(21) Appl. No.: 11/378,650

(22) Filed: Mar. 20, 2006

(65) Prior Publication Data

US 2006/0157850 A1    Jul. 20, 2006

Related U.S. Application Data

(62) Division of application No. 10/326,976, filed on Dec. 24, 2002, now Pat. No. 7,045,894.

(30) Foreign Application Priority Data

Dec. 25, 2001  (JP) .............................. 2001-392543

(51) Int. Cl.
*H01L 21/44* (2006.01)
*H01L 23/52* (2006.01)

(52) U.S. Cl. ...................... 438/611; 257/748

(58) Field of Classification Search ................ 438/411, 438/976, 611–614; 257/735–748
See application file for complete search history.

(56) References Cited

U.S. PATENT DOCUMENTS 5,656,863 A   8/1997  Yasunaga et al.

| 6,455,408 B1 | 9/2002 | Hwang et al. |
| 6,492,198 B2 | 12/2002 | Hwang |

FOREIGN PATENT DOCUMENTS

| JP | 08-321506 | 12/1996 |
| JP | 2000-040773 | 2/2000 |
| JP | 2000-252313 | 9/2000 |

OTHER PUBLICATIONS

U.S. Appl. No. 10/326,976, filed Dec. 24, 2002.
Japanese Office Action mailed Feb. 8, 2005 (w/English translation thereof).

*Primary Examiner*—Calvin Lee
(74) *Attorney, Agent, or Firm*—Nixon & Vanderhye P.C.

(57) ABSTRACT

A semiconductor device of the present invention is furnished with (a) a first protection film, formed on a substrate, having an opening section on an electrode pad, (b) a protrusion electrode, connected on the electrode pad at the opening section, whose peripheral portion is formed to overlap the first protection film, (c) a second protection film, formed to cover at least a gap at a boundary portion of the first protection film and the protrusion electrode, having an opening on a top area of the protrusion electrode except a portion around the boundary portion of the first protection film and the protrusion electrode, and (d) a coating layer formed to cover a surface of the protrusion electrode at the opening of the second protection film. With this arrangement, it is possible to provide a semiconductor device wherein the protrusion electrode is formed with an electroless plating method, capable of preventing the lowering of the adhesion strength of the protrusion electrode to the electrode pad.

11 Claims, 9 Drawing Sheets

SEMICONDUCTOR DEVICE AND MANUFACTURING METHOD THEREOF

This application is a Divisional of application Ser. No. 10/326,976, filed Dec. 24, 2002 and issued as U.S. Pat. No. 7,045,894. The entire content of which is hereby incorporated herein by reference in this application.

FIELD OF THE INVENTION

The present invention relates to a semiconductor device having a protrusion electrode for external connection of an electrode pad, and a manufacturing method thereof; and in particular relates to a semiconductor device wherein the protrusion electrode is formed with an electroless plating method, and a manufacturing method thereof.

BACKGROUND OF THE INVENTION

As a mounting technique for mounting a semiconductor device on another semiconductor device, a printed board, a tape carrier, etc., there is a technique for forming a protrusion electrode for external connection on an electrode pad of the semiconductor device. One of the methods of forming the protrusion electrode is to use an electroless plating method for forming the protrusion electrode on the electrode pad composed or mainly composed of Al.

Compared to an electrolytic plating method, the electroless plating method can eliminate steps such as a sputtering process required for forming a barrier metal layer and for forming an electrode in a plating process, a photo process required for forming a pattern of the protrusion electrode, and an etching process required for removing a resist used in the pattern forming process and for removing the barrier metal used in the plating process. As described above, the electroless plating method has beneficial features in reducing cost and in quickening the time of delivery.

However, the conventional arrangement for forming the protrusion electrode using the electroless plating method causes a problem in the adhesion strength of the protrusion electrode to the electrode pad. For explaining this problem, the following will explain steps for forming the protrusion electrode on the electrode pad composed of Al or alloy mainly composed of Al (Al alloy) using the electroless plating method, with reference to FIGS. 9(a) through 9(e).

Figure 9:
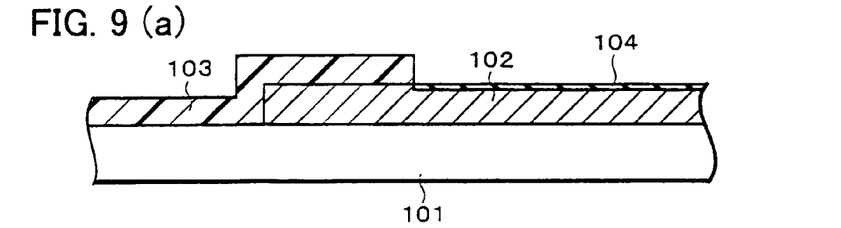
FIGS. 9(a) through 9(e) are sectional views showing steps of a manufacturing method of a conventional semiconductor device.

FIG. 9(a) shows a semiconductor device before the protrusion electrode is formed. An electrode pad 102 composed of Al or Al alloy is formed on a semiconductor substrate 101. On the electrode pad 102, a first protection film 103 is further formed so as to have an opening where the protrusion electrode is to be formed. Oxide film 104 exists over a surface of the electrode pad 102 where the first protection film 103 has the opening portion.

In a step shown in FIG. 9(b), the oxide film 104 over the surface of the electrode pad 102 is completely removed with sodium hydroxide, phosphoric acid, etc. The oxide film 104 is removed in a following reason. Namely, if the oxide film 104 exists over the surface of the electrode pad 102, a shape and reliability of the protrusion electrode are significantly affected while the protrusion electrode is formed on the electrode pad 102 using the electroless plating method. Thus, in the electroless plating method, the oxide film 104 is removed from the surface of the electrode pad 102 with sodium hydroxide or phosphoric acid as pre-treatment of plating, thereby ameliorating the shape of the protrusion electrode formed with Ni or Ni alloy.

FIG. 9(c) shows a zincate treatment, which is a pre-treatment process for depositing Ni or Ni alloy as the protrusion electrode on the electrode pad 102 using the electroless plating method. In the zincate treatment, the displacement reaction between Zn and Al or Al alloy composing the electrode pad 102 is uniformly carried out, thereby forming a Zn layer 105 on the surface of the electrode pad 102.

In a step shown in FIG. 9(d), a protrusion electrode 106 composed of Ni or Ni alloy is formed on the electrode pad 102 using the electroless plating method. In this step, a layer of Ni or Ni alloy as a core is first formed through displacement reaction with respect to Zn, and then the protrusion electrode 106 is formed through autocatalytic reaction. Thus, by uniformly forming Zn grains, the protrusion electrode formed with Ni or Ni alloy plating uniformly grows. As a result, the protrusion electrode 106 can be obtained in a small grain size and in a good shape.

As shown in FIG. 9(e), an Au layer 108 is formed on the protrusion electrode 106 composed of Ni or Ni alloy, in a displacement Au plating process. The Au layer 108 may achieve an effect of preventing the oxidation of Ni or Ni alloy composing the protrusion electrode 106.

In the step shown in FIG. 9(d), the protrusion electrode 106, which is formed through the autocatalytic reaction of Ni or Ni alloy, is also formed on the first protection film 103. At a boundary portion of the first protection film 103 and the protrusion electrode 106, however, a minute gap 107 remains without chemically bonded.

In the displacement Au plating process shown in FIG. 9(e), displacement Au plating liquid enters the minute gap 107 between the first protection film 103 and the protrusion electrode 106. Further, the displacement Au plating liquid entered into the gap 107 carries out incomplete displacement reaction between Ni and Au because the liquid is not sufficiently replaced. This causes a phenomenon that only Ni dissolves. Consequently, as shown in FIG. 9(e), the protrusion electrode 106 is thinned down at the opening portion of the first protection film 103, thereby significantly lowering the adhesion strength of the protrusion electrode 106 to the electrode pad 102.

SUMMARY OF THE INVENTION

In order to solve the foregoing problems, the object of the present invention is to provide a semiconductor device wherein a protrusion electrode is formed with an electroless plating method, capable of preventing the lowering of the adhesion strength of the protrusion electrode to an electrode pad, and a manufacturing method thereof.

In order to attain the foregoing object, a semiconductor device of the present invention is characterized by including (a) a first protection film, formed on a semiconductor substrate, having an opening section on an electrode pad, (b) a protrusion electrode, connected on the electrode pad at the opening section, whose peripheral portion is formed to overlap the first protection film, (c) a second protection film, formed to cover at least a gap at a boundary portion of the first protection film and the protrusion electrode, having an opening on a top area of the protrusion electrode except a portion around the boundary portion of the first protection film and the protrusion electrode, and (d) a coating layer formed to cover a surface of the protrusion electrode at the opening of the second protection film.

With this arrangement, the second protection film coats the gap generated between the first protection film and the protrusion electrode when the protrusion electrode is formed on the first protection film. With this, in a process for forming the coating layer which is formed to cover the protrusion electrode at the opening of the second protection film (usually a displacement Au plating process), it is possible to prevent the problems such that the displacement Au plating liquid entered the gap dissolves the metal that forms the protrusion electrode so as to lower the adhesion strength of the first protection film to the protrusion electrode.

In order to attain the foregoing object, a manufacturing method of a semiconductor device of the present invention, wherein a first protection film is formed on a semiconductor substrate expect at a portion on an electrode pad, and a protrusion electrode whose surface is coated with a coating layer is further formed on the electrode pad, is characterized by including the steps of (A) forming a protrusion electrode on the electrode pad with electroless plating, (B) forming a second protection film, so as to cover at least a gap at a boundary portion of the first protection film and the protrusion electrode, having an opening on an top area of the protrusion electrode except a portion around the boundary portion of the first protection film and the protrusion electrode, and (C) forming the coating layer for coating the surface of the protrusion electrode at the opening of the second protection film.

With this method, the protrusion electrode is formed on the electrode pad using the electroless plating in the step (A). Here, the protrusion electrode is formed to be higher than the first protection film, but the peripheral portion of the protrusion electrode is formed to overlap the first protection film. Further, since the protrusion electrode and the first protection film are not chemically bonded where the protrusion electrode overlaps the first protection film, a gap is generated between the first protection film and the protrusion electrode.

Next, the second protection film is formed in the step (B). The second protection film has the opening on almost an entire top area of the protrusion electrode except at the portion around the boundary portion of the first protection film and the protrusion electrode, so as to reveal the head of the protrusion electrode. In other words, the second protection film, which is formed in the step (B), coats the gap generated between the first protection film and the protrusion electrode.

Then, in the step (C), the coating layer for coating the surface of the protrusion electrode is formed with the displacement Au plating. Here, the gap generated between the first protection film and the protrusion electrode is coated with the second protection film.

Consequently, in the step (C), it is possible to prevent problems such that the displacement Au plating liquid entered the gap between the first protection film and the protrusion electrode dissolves the metal that forms the protrusion electrode so as to lower the adhesion strength of the first protection film to the protrusion electrode.

For a fuller understanding of the nature and advantages of the invention, reference should be made to the ensuing detailed description taken in conjunction with the accompanying drawings.

DESCRIPTION OF THE EMBODIMENTS

The following will explain an embodiment of the present invention with reference to FIGS. 1 through 8.

Figure 1:
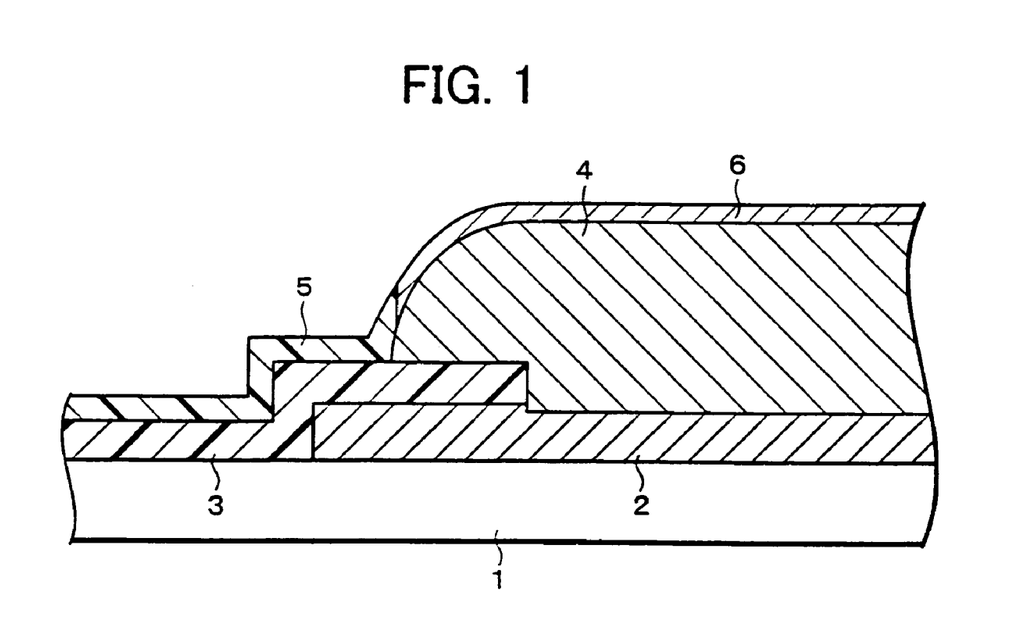
FIG. 1 is a sectional view showing an arrangement of a semiconductor device, and shows an embodiment of the present invention.

FIG. 1 shows an arrangement of a semiconductor device in accordance with the present embodiment.

As shown in FIG. 1, the semiconductor device is composed in a manner such that an active element (not shown) and wiring, etc., are formed on a substrate (semiconductor substrate) 1. An electrode pad 2 is formed as a part of the wiring. The electrode pad 2 is formed with Al or Al alloy, for example.

Note that, though a Si wafer is widely used as the substrate 1, the material of the substrate 1 is not particularly limited in the present invention, and may be appropriately selected in accordance with the usage of the semiconductor device.

Further, on the active element and the wiring, a first protection film 3 is formed for protection. Note that, the first protection film 3 has an opening section on the electrode pad 2, and a protrusion electrode 4 is formed on the electrode pad 2 at the opening section. The protrusion electrode 4 is formed with Ni or Ni alloy, for example.

On the first protection film 3 and the protrusion electrode 4, a second protection film 5 is formed. The second protection film 5 is provided for preventing plating liquid from entering a gap between the first protection film 3 and the protrusion electrode 4 during a step of forming a coating layer 6 as later described. Thus, the second protection film 5 is formed so as to coat at least a boundary portion of the first protection film 3 and the protrusion electrode 4. Further, the second protection film 5 has an opening portion on almost an entire top area of the protrusion electrode 4 except at a portion around the boundary portion of the first protection film 3 and the protrusion electrode 4.

Then, on the protrusion electrode 4, the coating layer 6 is formed at the opening portion of the second protection film 5. The coating layer 6 coats the surface of the protrusion electrode 4, for preventing the oxidation of the metal that forms the protrusion electrode 4, and for achieving effects of thermo compression bonding in connection with another device when the semiconductor device is mounted. The coating layer 6 is preferably formed with Au.

Next, a method of forming the protrusion electrode in the semiconductor device will be explained with reference to FIGS. 2(a) through 2(d), and 3(a) through 3(c).

Figure 2:
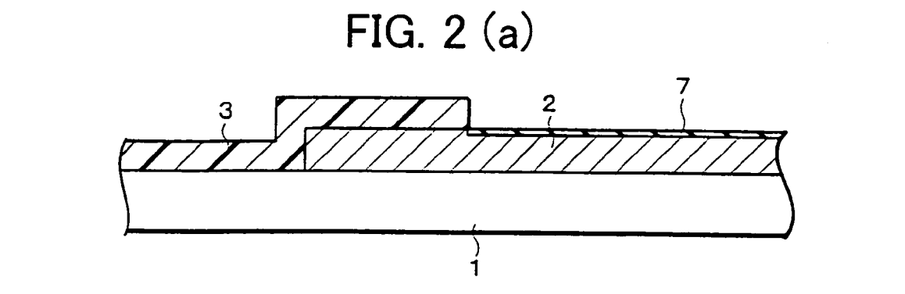
FIGS. 2(a) through 2(d) are sectional views showing a part of steps in a manufacturing method of the semiconductor device.

FIG. 2(a) shows the semiconductor device before the protrusion electrode 4 is formed, wherein the first protection film 3 is formed on the substrate 1 after the active element, the wiring, etc. are formed on the substrate 1. The first protection film 3 has been already provided with the opening section on the electrode pad 2. Further, oxide film 7 has been already formed on the surface of the electrode pad 2. In some cases, fluoride has been formed in accordance with fluorine gas used for etching the first protection film 3 (for forming the opening on the electrode pad 2).

If the protrusion electrode 4 is formed when the oxide film 7 is formed on the surface of the electrode pad 2, the shape and reliability of the protrusion electrode 4 are greatly affected, as has been described in the background art. For removing the oxide film 7 (or the fluoride), the etching is carried out on the electrode pad 2 with sodium hydroxide or phosphoric acid, for example, before the protrusion electrode 4 is formed. FIG. 2(b) shows the semiconductor device in which the oxide film 7 (or the fluoride) is removed by the etching.

After the oxide film 7 is removed, a Zn layer 8 is formed with a displacement plating method as a further pre-treatment process, before the protrusion electrode 4 is formed on the surface of the electrode pad 2. FIG. 2(c) shows a state wherein the displacement reaction between Zn and Al on the surface of the electrode pad 2 is uniformly carried out on the electrode pad 2.

The Zn layer 8 is formed in a manner such that sequential steps of (1) immersing the semiconductor device of FIG. 2(b) into an alkaline solution including Zn, (2) rinsing the semiconductor device with purified water, and (3) immersing the semiconductor device into nitric acid, are carried out about once or twice, and then the step (1) is carried out again.

Thus, the semiconductor device is immersed into the alkaline solution including Zn at least twice, and, in this case, the electrode pad 2 composed of Al or Al alloy is etched for approximately 400 nm with the alkaline solution. Consequently, in the previous step of etching the electrode pad 2 for removing the oxide film 7, the electrode pad 2 must retain a thickness of at least 500 nm after the etching. If the Al layer that forms the electrode pad 2 is lost in the step of forming the Zn layer 8, the protrusion electrode 4 loses its adhesion strength, thereby causing the lowering of the reliability of the semiconductor device when mounted.

Further, in the step of FIG. 2(c), Pd may be deposited on the surface of the electrode pad 2 through Pd catalytic activation instead of the displacement reaction of Zn. The Pd catalytic activation process displaces Al for an amount smaller than that displaced in the displacement reaction of Zn, thus resulting in a smaller etched amount of the Al layer that forms the electrode pad 2.

FIG. 2(d) shows a state wherein the protrusion electrode 4 is formed on the electrode pad 2. In this step, the protrusion electrode 4 is formed by immersing the semiconductor device of FIG. 2(c) into acidic solution including Ni and a reductant of Ni, in a process such that Ni layer is formed on the electrode pad 2 through the displacement reaction between Zn and Ni or Ni alloy, and then Ni or Ni alloy is deposited through autocatalytic reaction. Here, since Zn grains are uniformly deposited in the Zn layer 8, the displacement reaction between Zn and Ni as well as the autocatalytic reaction of Ni are uniformly carried out, thereby forming the protrusion electrode 4 in a good shape.

Here, the protrusion electrode 4 is formed to be higher than the first protection film 3, in consideration of obtaining a space on a mounting surface when the semiconductor device is mounted on another device. The protrusion electrode 4 here is only required to have a height H of approximately 5 µm. By forming the protrusion electrode 4 higher than the first protection film 3 as described above, a peripheral portion of the protrusion electrode 4 is formed to overlap the first protection film 3, as shown in FIG. 2(d).

Note that, the protrusion electrode 4 which is generally composed of Ni or Ni alloy is not chemically bonded with the first protection film 3 which is generally composed of inorganic film or resin. This generates a minute gap 9 between the first protection film 3 and the protrusion electrode 4 (namely, at the boundary portion of the first protection film 3 and the protrusion electrode 4).

Figure 3:
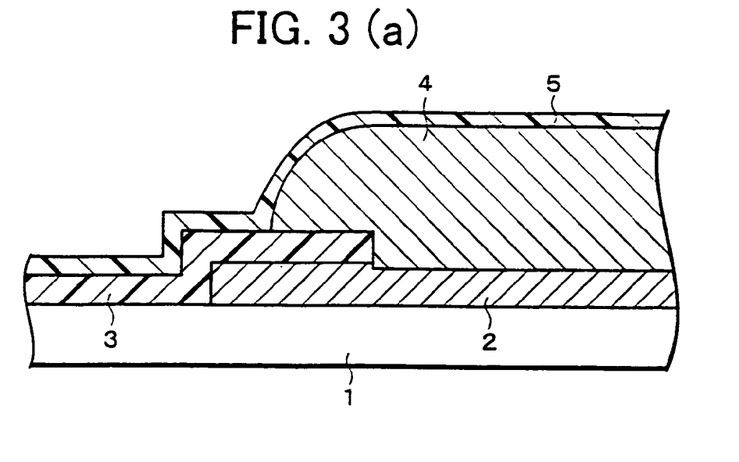
FIGS. 3(a) through 3(c) are sectional views showing a part of steps in the manufacturing method of the semiconductor device.

FIG. 3(a) shows a state wherein the second protection film 5 is formed on the semiconductor device of FIG. 2(d) on a side where the protrusion electrode 4 is formed. The second protection film 5 may be inorganic insulation film or organic insulation film, but FIG. 3(a) shows a case where the second protection film 5 is formed with the organic insulation film, as an example.

When the second protection film 5 is formed with the inorganic insulation film ($SiN$, $SiO_2$, $SiO$, $SiON$, etc.), SiN film or $SiO_2$ film is formed so as to have a thickness of no less than 500 nm, using a P-CVD (Plasma Chemical Vapor Deposition) method, etc., for example. Further, when the second protection film 5 is formed with the organic insulation film (PI, BCB, etc.), polyimide resin, etc. may be applied so as to be lower than the protrusion electrode 4, using a spin coat method, etc., for example.

The second protection film 5 is provided with an opening portion on the protrusion electrode 4 in an area smaller than the protrusion electrode 4, as shown in FIG. 3(b). Namely, a diameter D1 of the protrusion electrode 4 is larger than a diameter D2 of the opening portion. This second protection film 5 completely coats the gap 9 generated between the first protection film 3 and the protrusion electrode 4.

Various methods can be used for forming the opening portion at the second protection film 5, but three methods will be explained here as examples. First, a first method will be explained with reference to FIGS. 4(a) through 4(e).

Figure 4:
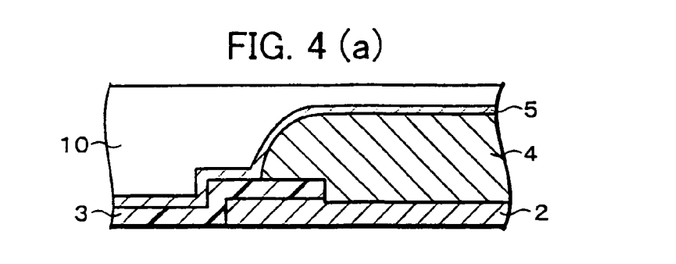
FIGS. 4(a) through 4(e) are sectional views showing an example of steps for forming an opening at a second protection film in the manufacturing method of the semiconductor device.

In this case, as shown in FIG. 4(a), a resist 10 is applied on an entire surface of the second protection film 5 in the semiconductor device of FIG. 3(a). Then, as shown in FIG. 4(b), the resist 10 is exposed via a photomask 11 having an opening where the second protection film 5 is to be removed.

Next, by developing the exposed resist 10, the resist 10 is removed at the exposed area, as shown in FIG. 4(c). Further, by carrying out etching with the developed resist 10 as a mask, the second protection film 5 is provided with the opening, as shown in FIG. 4(d). Then, by exfoliating the resist 10 as shown in FIG. 4(e), the semiconductor device of FIG. 3(b) can be obtained, in which the second protection film 5 has the opening at a predetermined portion.

Here, when the second protection film 5 is formed with the inorganic insulation film such as SiN, a dry etching device is used. The dry etching can be carried out in the same condition as in a general method of etching SiN. Here, the etching is carried out for approximately one or two minutes in vacuum using a gas such as $CF_4$.

Next, a second method will be explained with reference to FIGS. 5(a) and 5(b). This method can be used when the second protection film 5 is formed with photosensitive polyimide resin, etc.

Figure 5:
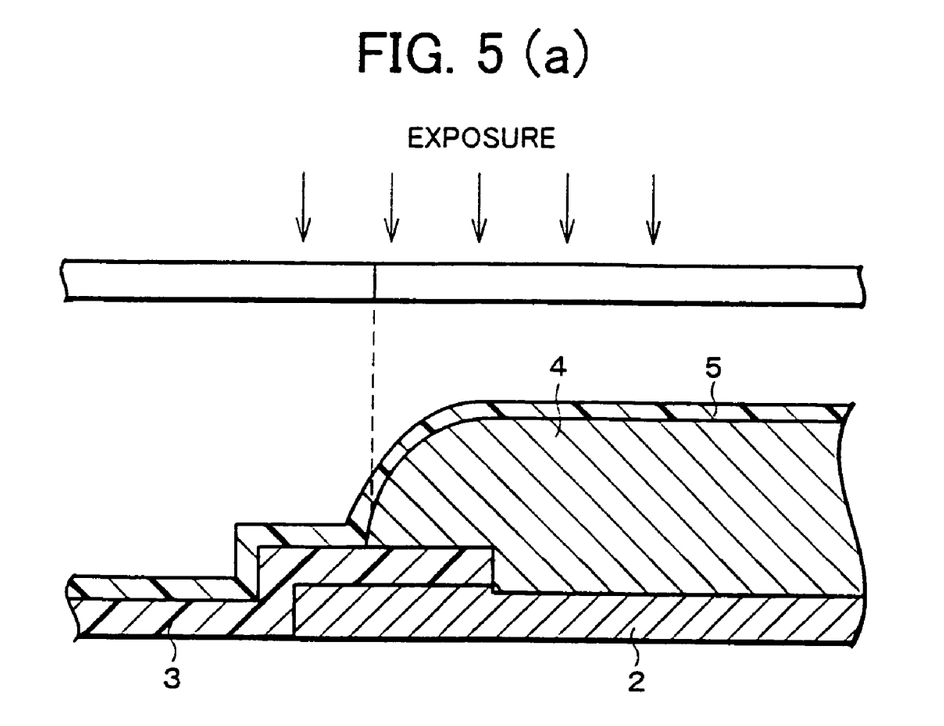
FIGS. 5(a) and 5(b) are sectional views showing an example of steps for forming an opening at a second protection film in the manufacturing method of the semiconductor device.

In this case, first, as shown in FIG. 5(a), the second protection film 5 is directly exposed via the photomask 11 having an opening where the second protection film 5 is to be removed. Then, as shown in FIG. 5(b), by developing the exposed second protection film 5, the semiconductor device of FIG. 3(b) can be obtained, in which the second protection film 5 has the opening at a predetermined portion.

Figure 6:
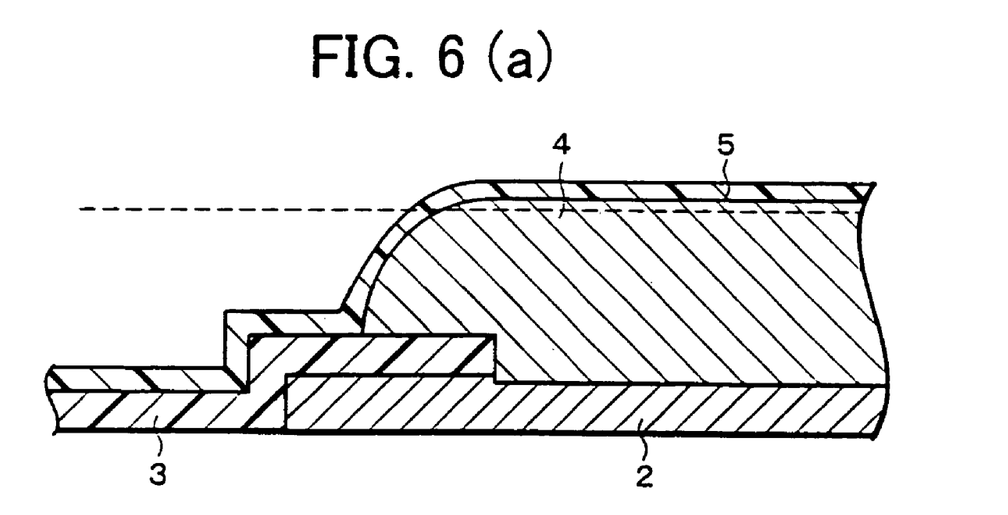
FIGS. 6(a) and 6(b) are sectional views showing an example of steps for forming an opening at a second protection film in the manufacturing method of the semiconductor device.

Last, a third method will be explained with reference to FIGS. 6(a) and 6(b). With this method, the second protection film 5 is mechanically removed on the protrusion electrode 4. More specifically, as shown in FIG. 6(a), the second protection film 5 is abraded until the top area of the protrusion electrode 4 is revealed (until a dashed line in FIG. 6(a)). With this, as shown in FIG. 6(b), the semiconductor device of FIG. 3(b) can be obtained, in which the second protection film 5 has the opening at a predetermined portion.

After the second protection film 5 is provided with the opening at a predetermined portion as shown in FIG. 3(b), the coating-layer 6 is formed at the opening portion of the second protection film 5 in a step shown in FIG. 3(c). The top surface of the protrusion electrode 4 is thus coated with the coating layer 6, thereby completing the semiconductor device in accordance with the present embodiment.

The coating layer 6 is preferably formed by plating Au on the protrusion electrode 4. When formed with the Au plating, the coating layer 6 is formed using displacement Au plating, but may be further formed to have an increased thickness using electroless Au plating.

More specifically, in the displacement Au plating, the semiconductor device of FIG. 3(b) is immersed into displacement Au plating liquid for 10 through 30 minutes, so that Au is deposited for a thickness of approximately 0.05 µm on the surface of the protrusion electrode 4 through displacement reaction between Ni and Au.

Here, the coating layer 6 formed using the Au plating is mainly provided for preventing the oxidation of the protrusion electrode 4, as described above, but also for achieving effects of thermo compression bonding in the connection with another device when the semiconductor device is mounted. When the protrusion electrode 4 of the semiconductor device is connected to an inner lead of a TCP (Tape Carrier Package) having a device hole, in particular, the bonding is generally carried out in a manner such that a surface of the inner lead is plated with Sn, and then Sn and Au are alloyed using thermo compression bonding.

Note that, when carrying out the bonding through Sn—Au alloying as described above, the thickness of Au plating of the coating layer 6 is not sufficient with the above-described thickness of approximately 0.05 µm (approximately 0.08 µm in the maximum). In this case, the Au plating layer as the coating layer 6 is further formed thicker using the electroless plating. In other words, in this case, the displacement Au plating is carried out as a pre-treatment process of the electroless Au plating.

With the electroless Au plating, the Au layer further grows because the plating solution contains a redundant, thereby forming the Au layer as the coating layer 6 to have a thickness of approximately 1 µm in the end.

In the semiconductor device manufactured with the above-described method, the second protection film 5 coats the gap 9 generated between the first protection film 3 and the protrusion electrode 4. This prevents the displacement Au plating liquid from entering the gap 9 during the displacement Au plating for forming the coating layer 6. This can prevent problems such that the displacement Au plating liquid entered the gap 9 dissolves Ni that forms the protrusion electrode 4 and the protrusion electrode 4 is thinned down at the opening section of the first protection film 3 so as to lower the adhesion strength of the protrusion electrode 4 to the electrode pad 2.

Next, an example of mounting the semiconductor device in accordance with the present embodiment will be explained.

Figure 7:
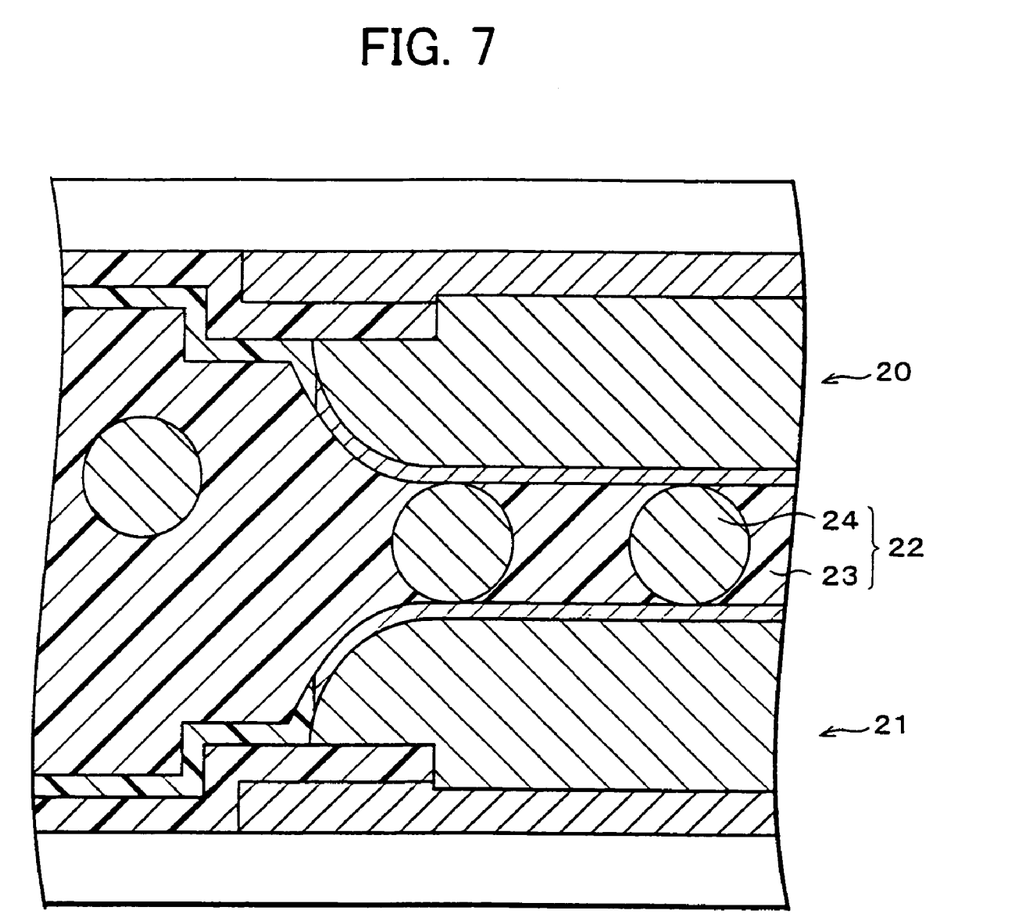
FIG. 7 is a sectional view showing an example where the semiconductor device of the present invention is mounted on another device using anisotropic conductive film.

FIG. 7 shows an example of connecting the semiconductor devices with each other. In this case, two semiconductor devices 20 and 21 are connected using thermo compression bonding in a manner such that one of the semiconductors 20 and 21 is tentatively compressed with anisotripic conductive film 22 (or is applied with anisotropic conductive paste), while the other of the semiconductors 20 and 21 is aligned on that. The anisotropic conductive film 22 is composed of conductive grains 24 dispersed into insulation binder resin 23. The both protrusion electrodes of the connected semiconductor devices 20 and 21 are connected with each other via the conductive grains 24. The optimal condition for the thermo compression bonding here is a temperature of approximately 200° C. and a pressure of approximately 1000 kg/cm².

Further, the example of connecting the semiconductor devices shown in FIG. 7 assumes a case where the coating layer for coating the protrusion electrode is formed by using only the displacement Au plating. However, the semiconductor devices may be directly connected with each other using thermo compression bonding of Au—Au, provided that the Au layer as the coating layer is formed to have the increased thickness using the electroless Au plating or the electrolytic Au plating in at least one of the semiconductor devices.

Further, in addition to the case of connecting the semiconductor devices with each other, the above-described connecting method can be applied to cases where the semiconductor device in accordance with the present embodiment is mounted on another printed board, TCP, COF (Chip On Film), etc. Note that, when the semiconductor device is mounted on insulation film such as the TCP and the COF, the insulation film having no device hole is used.

Figure 8:
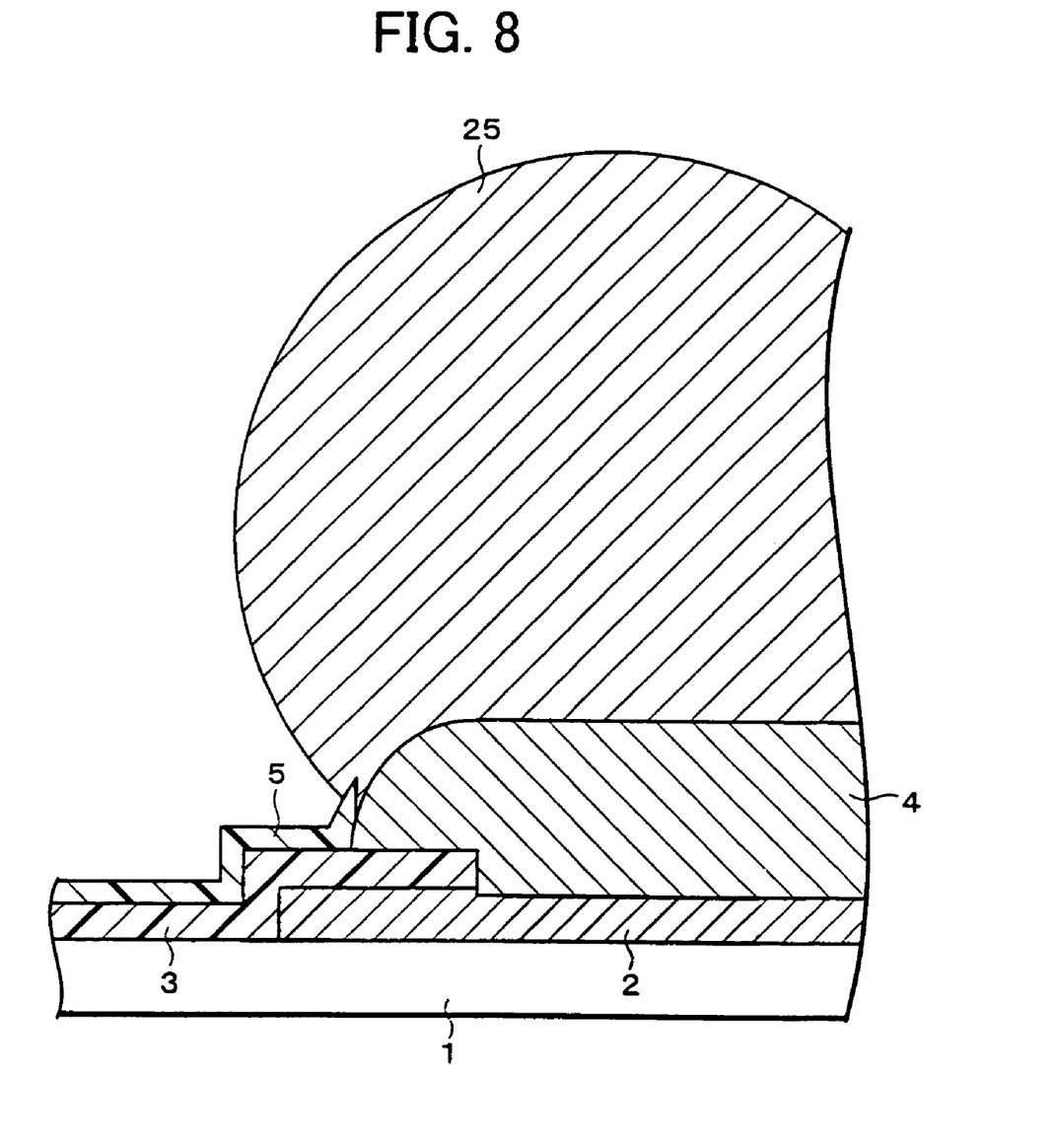
FIG. 8 is a sectional view showing an example where a solder bump is formed on a protrusion electrode of the semiconductor device of the present invention.

Further, in the semiconductor device in accordance with the present embodiment, a solder bump 25 may be formed on the protrusion electrode 4, as shown in FIG. 8. The solder bump 25 can be formed in a general method wherein flux is applied on the protrusion electrode 4, a solder ball is mounted, and reflowing is performed. The solder bump 25 may also be formed using solder plating.

In a case where the solder bump 25 is formed on the protrusion electrode 4, Sn enters the gap between the electrode pad 2 and the Ni protrusion electrode 4 so as to form fragile metal alloy composed of Sn, if the second protection film 5 is not formed. This lowers the adhesion strength of the protrusion electrode 4. In contrast, with the arrangement where the second protection film 5 is formed, the second protection film 5 prevents the entrance of Sn, thereby preventing the lowering the adhesion strength of the protrusion electrode 4.

Note that, for forming the solder bump 25, Au is required to be formed as the coating layer 6 on the protrusion electrode 4. In the arrangement of FIG. 8, the coating layer 6 is fused into the solder bump 25.

Incidentally, in the present invention, the materials of the electrode pad, the protrusion electrode, the coating layer, etc., are not limited to those have been explained. For example, the electrode pad may be formed with Cu, etc., instead of Al or Al alloy. When the electrode pad is formed with Cu, the Zn displacement reaction process shown in FIG. 2(c) will be replaced with the Pd catalytic activation process. Further, the protrusion electrode may be arranged to have Cu layer-Ni layer-Au layer, Cu layer-Au layer, etc. on the electrode pad, instead of being formed with the Ni layer or, the Ni alloy layer as explained above.

As described above, a semiconductor device of the present invention is characterized by including (a) a first protection film, formed on a semiconductor substrate, having an opening section on an electrode pad, (b) a protrusion electrode, connected on the electrode pad at the opening section, whose peripheral portion is formed to overlap the first protection film, (c) a second protection film, formed to cover a boundary portion of the first protection film and the protrusion electrode, having an opening on almost an entire top area of the protrusion electrode except a portion around the boundary portion of the first protection film and the protrusion electrode, and (d) a coating layer formed to cover a surface of the protrusion electrode at the opening of the second protection film.

With this arrangement, the second protection film coats the gap generated between the first protection film and the protrusion electrode when the protrusion electrode is formed on the first protection film. With this, in a process for forming the coating layer which is formed to cover the protrusion electrode at the opening of the second protection film (usually a displacement Au plating process), it is possible to prevent the problems such that the displacement Au plating liquid entered the gap dissolves the metal that forms the protrusion electrode so as to lower the adhesion strength of the first protection film to the protrusion electrode.

The semiconductor device of the present invention is preferably arranged so that the protrusion electrode is formed with Ni or Ni alloy.

As in this arrangement, the protrusion electrode is beneficially formed with Ni or Ni alloy, not only because the cost is low and the displacement Au plating is easily carried out, but also the hard material can reduce the damage when connected to the electrode pad (if the protrusion electrode is made of a soft material, the electrode pad spreads sideways, thereby causing a crack on a foundation of the electrode pad).

The semiconductor device of the present invention may be so arranged that the second protection film is formed with inorganic insulation film.

With this arrangement, it is possible to achieve high reliability due to the characteristics of the inorganic film.

The semiconductor device of the present invention may be so arranged that the second protection film is formed with organic insulation film.

With this arrangement, the second protection film can be formed with photosensitive resin. This simplifies the process for forming the opening at the second protection film, thereby reducing the cost.

The semiconductor device of the present invention may be so arranged that a solder bump is formed on the protrusion electrode.

As in this arrangement, when the solder bump is formed on the protrusion electrode, Sn enters the gap between the electrode pad and the Ni protrusion electrode so as to form fragile metal alloy composed of Sn, if the second protection film is not formed. This lowers the adhesion strength of the protrusion electrode.

In contrast, with the arrangement where the second protection film is formed, the second protection film prevents the entrance of Sn, thereby preventing the lowering the adhesion strength of the protrusion electrode. Thus, the above arrangement can preferably adopt the present invention.

A manufacturing method of a semiconductor device of the present invention, wherein a first protection film is formed on a semiconductor substrate expect at a portion on an electrode pad, and a protrusion electrode whose surface is coated with a coating layer is further formed on the electrode pad, is characterized by including the steps of (1) forming a protrusion electrode on the electrode pad with electroless plating, (2) forming a second protection film on the semiconductor substrate on a side where the protrusion electrode is formed, (3) forming an opening at the second protection film, on almost an entire top area of the protrusion electrode except at a portion around a boundary portion of the first protection film and the protrusion electrode, so as to reveal a head of the protrusion electrode, and (4) forming the coating layer for coating the surface of the protrusion electrode at the opening of the second protection film with displacement Au plating.

With this method, the protrusion electrode is formed on the electrode pad using the electroless plating in the step (1). Here, the protrusion electrode is formed to be higher than the first protection film, but the peripheral portion of the protrusion electrode is formed to overlap the first protection film. Further, since the protrusion electrode and the first protection film are not chemically bonded where the protrusion electrode overlaps the first protection film, a gap is generated between the first protection film and the protrusion electrode.

Next, the second protection film is formed in the step (2). In the step (3), the opening is formed at the second protection film on almost the entire top area of the protrusion electrode except at the portion around the boundary portion of the first protection film and the protrusion electrode, so as to reveal the head of the protrusion electrode. In other words, the second protection film, which is formed in the steps (2) and (3), coats the gap generated between the first protection film and the protrusion electrode.

Then, in the step (4), the coating layer for coating the surface of the protrusion electrode is formed with the displacement Au plating. Here, the gap generated between the first protection film and the protrusion electrode is coated with the second protection film.

Consequently, in the step (4), it is possible to prevent problems such that the displacement Au plating liquid entered the gap generated between the first protection film and the protrusion electrode dissolves the metal that forms the protrusion electrode so as to lower the adhesion strength of the first protection film to the protrusion electrode.

The manufacturing method of the semiconductor device of the present invention, wherein the step (3) of forming the opening at the second protection film may include the steps of (i) forming a resist on the second protection film, (ii) patterning the resist with a photolithography technique, (iii) etching the second protection film with the patterned resist as a mask, and (iv) exfoliating the resist.

With this method, when the inorganic film, which has high reliability, is used for forming the second protection film, it is possible to form the opening at the second protection film.

The manufacturing method of the semiconductor device of the present invention, wherein the step (3) of forming the opening at the second protection film may include the step of patterning the second protection film with a photolithography technique, wherein the second protection film is formed with photosensitive resin.

With this method, it is possible to eliminate steps such as applying, exposing, revealing, and exfoliating the resist, and thus the second protection film can be formed in simplified steps, thereby reducing the cost.

The manufacturing method of the semiconductor device of the present invention, wherein the step (3) of forming the opening at the second protection film may include the step of mechanically abrading the second protection film on the protrusion electrode so as to reveal the head of the protrusion electrode.

With this method, by mechanically abrading the top portion of the protrusion electrode, it is possible to reduce unevenness in height of the protrusion electrode on a wafer surface, thereby forming the head of the protrusion electrode flat. This can reduce connection defects and the like caused by the unevenness in height of the protrusion electrode, thereby widening a margin of conditions for connection.

The manufacturing method of the semiconductor device of the present invention, may further include the step of (5) forming the coating layer to have an increased thickness with electroless Au plating, after carrying out the step (4).

With this method, when the protrusion electrode of the semiconductor device is connected to an inner lead of a TCP having a device hole, for example, it is possible to carry out the connection by alloying Sn and Au using thermo compression bonding, after a surface of the inner lead is plated with Sn.

The manufacturing method of the semiconductor device of the present invention may further include the step of (6) forming a solder bump on the protrusion electrode by mounting a solder ball on the protrusion electrode and by performing reflowing on the solder ball, after carrying out the step (4).

The manufacturing method of the semiconductor device of the present invention may further include the step of (7) forming a solder bump on the protrusion electrode with electroless solder plating, after carrying out the step (4).

As in these methods, when the solder bump is formed on the protrusion electrode, Sn enters the gap between the electrode pad and the Ni protrusion electrode so as to form fragile metal alloy composed of Sn, if the second protection film is not formed. This lowers the adhesion strength of the protrusion electrode.

In contrast, with the arrangement where the second protection film is formed, the second protection film prevents the entrance of Sn, thereby preventing the lowering the adhesion strength of the protrusion electrode. Thus, the above arrangements can preferably adopt the present invention.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A manufacturing method of a semiconductor device, wherein a first protection film is formed on a semiconductor substrate expect at a portion on an electrode pad, and a protrusion electrode whose surface is coated with a coating layer is further formed on the electrode pad comprising the steps of:
   (A) forming the protrusion electrode on the electrode pad with electroless plating;
   (B) forming a second protection film, so as to cover at least a gap at a boundary portion of the first protection film and said protrusion electrode, having an opening on a top area of said protrusion electrode except a portion around the boundary portion of said first protection film and said protrusion electrode; and
   (C) forming the coating layer for coating the surface of said protrusion electrode at the opening of said second protection film.

2. The manufacturing method of the semiconductor device as set forth in claim 1, wherein said step (B) comprising the steps of:
   (D) forming said second protection film on the semiconductor substrate on a side where said protrusion electrode is formed; and
   (E) forming the opening at said second protection film, on the top area of said protrusion electrode except at the portion around the boundary portion of said first protection film and said protrusion electrode, so as to reveal a head of said protrusion electrode.

3. The manufacturing method of the semiconductor device as set forth in claim 2, wherein said step (E) of forming the opening at said second protection film comprising the steps of:
   (i) forming a resist on said second protection film;
   (ii) patterning the resist with a photolithography technique;
   (iii) etching said second protection film with the patterned resist as a mask; and
   (iv) exfoliating the resist.

4. The manufacturing method of the semiconductor device as set forth in claim 2, wherein said step (E) of forming the opening at said second protection film comprising the step of:
   patterning said second protection film with a photolithography technique,
   wherein said second protection film is formed with photosensitive resin.

5. The manufacturing method of the semiconductor device as set forth in claim 2, wherein said step (E) of forming the opening at said second protection film comprising the step of:
   mechanically abrading said second protection film on said protrusion electrode so as to reveal the head of said protrusion electrode.

6. The manufacturing method of the semiconductor device as set forth in claim 1, wherein:
   said step (C) is a step of forming said coating layer with displacement Au plating.

7. The manufacturing method of the semiconductor device as set forth in claim 6, further comprising the step of:
   (F) forming said coating layer to have an increased thickness with electroless Au plating, after carrying out said step (CI).

8. The manufacturing method of the semiconductor device as set forth in claim 6, further comprising the step of:
   (G) forming a solder bump on said protrusion electrode by mounting a solder ball on said protrusion electrode and by performing reflowing on said solder ball, after carrying out said step (C).

9. The manufacturing method of the semiconductor device as set forth in claim 6, further comprising the step of:
   (H) forming a solder bump on said protrusion electrode with electroless solder plating, after carrying out said step (C).

10. The manufacturing method of the semiconductor device as set forth in claim 1, wherein said step (A) comprising the step of:
   forming said protrusion electrode with electroless plating of Ni or Ni alloy.

11. A manufacturing method of a semiconductor device, wherein a first protection film is formed on a semiconductor substrate expect at a portion on an electrode pad, and a protrusion electrode whose surface is coated with a coating layer is further formed on the electrode paid, comprising the steps of:
   (a) removing oxide film on a surface of the electrode pad composed of or mainly composed of Al;
   (b) forming Zn on the surface of the electrode pad through displacement reaction;
   (c) forming the protrusion electrode with electroless plating of NI or Ni alloy;
   (d) forming a second protection film so as to cover the first protection film and said protrusion electrode;
   (e) forming an opening by removing said second protection film so as to reveal a top area of said protrusion electrode except a portion around the boundary portion of said first protection film and said protrusion electrode; and
   (f) forming the coating layer with displacement Au plating, for coating the top area of said protrusion electrode at a portion not covered with said second protection film.

* * * * *